(12) United States Patent
Iraqi et al.

(10) Patent No.: US 9,603,261 B2
(45) Date of Patent: Mar. 21, 2017

(54) METHOD FOR IMPROVING COATING

(75) Inventors: Muhammad Iraqi, Tira (IL); Noam Rozenstein, Afula (IL); Eva Igner, Haifa (IL); Michael Litvin, Rishon le Zion (IL); Yaron Mazor, Ramat Yishay (IL)

(73) Assignee: CAMTEK LTD., Migdal Haemeq (IL)

( * ) Notice: Subject to any disclaimer, the term of this patent is extended or adjusted under 35 U.S.C. 154(b) by 639 days.

(21) Appl. No.: 13/316,591

(22) Filed: Dec. 12, 2011

(65) Prior Publication Data

US 2012/0177814 A1 Jul. 12, 2012

Related U.S. Application Data

(60) Provisional application No. 61/427,219, filed on Dec. 27, 2010.

(51) Int. Cl.
*B05D 5/12* (2006.01)
*H05K 3/34* (2006.01)

(52) U.S. Cl.
CPC ... *H05K 3/3452* (2013.01); *H05K 2203/1476* (2013.01)

(58) Field of Classification Search
USPC ..... 427/97.4, 97.6, 98.4, 99.2, 383.1, 374.1, 427/379
See application file for complete search history.

(56) References Cited

U.S. PATENT DOCUMENTS

| | | | | |
|---|---|---|---|---|
| 3,652,333 A * | 3/1972 | Warren | ................. | 427/96.2 |
| 4,774,279 A * | 9/1988 | Kohm | ................. | 524/509 |
| 4,880,663 A * | 11/1989 | Shimada | ................. | 427/96.4 |
| 5,266,349 A * | 11/1993 | Bok | ................. | 427/8 |
| 5,407,708 A * | 4/1995 | Lovin et al. | ................. | 427/493 |
| 5,645,884 A * | 7/1997 | Harlow et al. | ................. | 427/8 |
| 5,871,822 A * | 2/1999 | Lepsche et al. | ................. | 427/96.4 |
| 6,389,690 B1 * | 5/2002 | McCullough et al. | ................. | 29/840 |
| 6,517,895 B1 | 2/2003 | Wolfer et al. | | |
| 6,588,892 B1 * | 7/2003 | Stramel et al. | ................. | 347/102 |
| 6,869,750 B2 * | 3/2005 | Zhang et al. | ................. | 430/312 |
| 7,040,729 B2 * | 5/2006 | Richards | ................. | 347/7 |
| 7,752,751 B2 * | 7/2010 | Kapusta et al. | ................. | 29/852 |
| 2007/0289459 A1 * | 12/2007 | Laksin et al. | ................. | 101/177 |
| 2009/0163615 A1 * | 6/2009 | Halahmi et al. | ................. | 522/146 |
| 2009/0291200 A1 * | 11/2009 | Bedinger et al. | ................. | 427/96.2 |
| 2011/0091697 A1 * | 4/2011 | Tseng et al. | ................. | 428/209 |

* cited by examiner

*Primary Examiner* — Brian K Talbot
(74) *Attorney, Agent, or Firm* — Reches Patents

(57) ABSTRACT

A system and a method, the method includes determining or receiving a multiple iteration printing scheme indicative of multiple printing iterations of a coating material to be applied on an electrical circuit that comprises at least one three dimensional structure to be coated by the coating material; wherein the multiple iteration printing scheme is responsive to a shape and size of the at least one three dimensional structure; and performing multiple printing iterations of the coating material, according to the multiple iteration printing scheme; wherein at least one printing iteration is followed by at least partially curing the coating material printed during the at least one printing iteration.

29 Claims, 6 Drawing Sheets

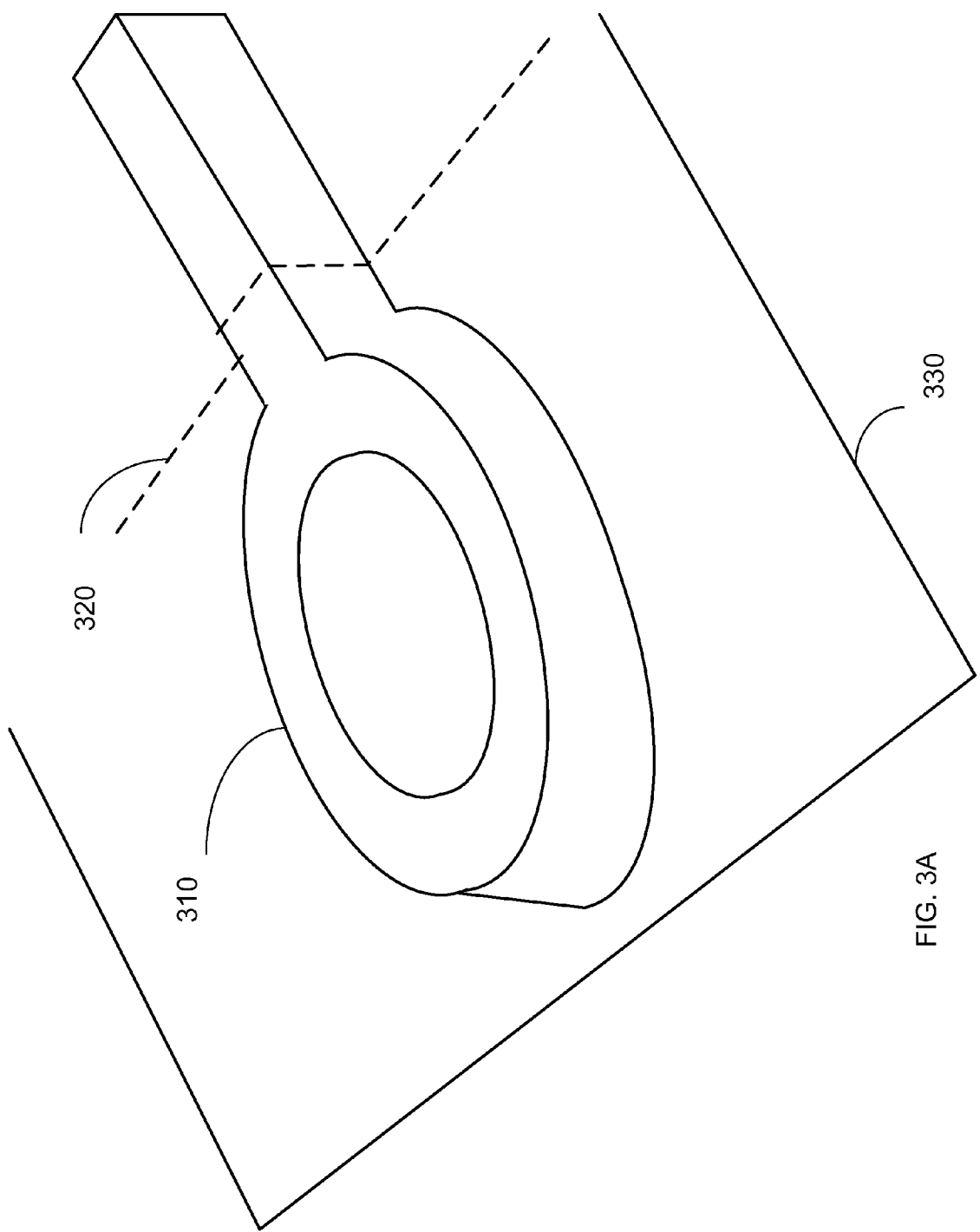

Receiving a multiple iteration printing scheme indicative of multiple printing iterations of a coating material to be applied on an electrical circuit that comprises at least one three dimensional structure to be coated by the coating material. The multiple iteration printing scheme is responsive to a shape and size of the at least one three dimensional structure. 420

Determining the multiple iteration printing scheme in response to design information about the at least one three dimensional structure. 411

Determining the multiple iteration printing scheme in response to design information about the at least one three dimensional structure be coated by the coating material and in response an expected thickness of a layer of coating material to be printed during a single printing iteration. 412

Determining an amount of printing iteration to be not smaller than a ratio between a height of a highest three-dimensional structure that should be coated by the solder mask and an expected thickness of a layer of coating material to be printed during a single printing iteration. 413

Determining an amount of printing iteration to be not smaller than a ratio between a minimal thickness of the coating material to be printed as a result of the multiple printing iterations and an expected thickness of a layer of coating material to be printed during a single printing iteration. 414

Simulating the multiple printing iterations of the coating material. 416

Determining a multiple iteration printing scheme indicative of multiple printing iterations of a coating material to be applied on an electrical circuit that comprises at least one three dimensional structure to be coated by the coating material. The multiple iteration printing scheme is responsive to a shape and size of the at least one three dimensional structure. 410

Performing a printing iteration of the coating material. 432

Performing, on the coating material printed during the printing iteration at least one operation out of freezing the coating material, partially curing the coating material, fully curing the coating material or doing nothing. 434

Determining whether all the printing iterations were completed. 436

Changing at least one parameter of the printing operation – if required according to the multiple printing iteration scheme. 438

Performing multiple printing iterations of the coating material, according to the multiple iteration printing scheme. 430

400  Fig. 4

METHOD FOR IMPROVING COATING

RELATED APPLICATIONS

This application claims the priority of U.S. provisional patent Ser. No. 61/427,219, filing date Dec. 27, 2010 which is incorporated herein by reference.

BACKGROUND

Certain processes require application of a coating over features that are not planar. One such process in the electronics manufacturing industry is the application of protective coating over metallic conductors that exist on an insulating planar substrate. These conductors may have various shapes, their height-to-width aspect ratio may be very small or very large, and their absolute height above the plane may substantially vary from place to place. Yet, there usually is a requirement to cover certain parts of the substrate and certain parts of the metallic portions above the plane with an even coating of a pre-specified thickness.

Inkjet printing has inherent deficiency in covering vertical portions protruding above the plane. In vertical or steep portions, the ink may flow and result in a coating with thickness that is below the required amount or result in a totally uncoated area.

For example, during the electronic printed circuit board (PCB) manufacturing process, a planar substrate (laminate) having conducting traces which usually consist of copper with varying thicknesses across the PCB has to be covered with a layer of solder mask over certain portions of the PCB. The purpose of the solder mask is to create a protective layer over the conductors and to enable soldering in the required areas (pads, etc) by leaving them uncoated. The solder mask is printed on the laminate and on the copper conductors that are higher than the laminate and is expected to cover the copper conductors with even thickness in order to withstand erosion during the manufacturing processes that follow, due to the aggressive chemicals applied.

There is a growing need to provide efficient processes for printing an even coating regardless of the 3D profile of the printed surface.

SUMMARY

A method may be provided and may include determining or receiving a multiple iteration printing scheme indicative of multiple printing iterations of a coating material to be applied on an electrical circuit that may include at least one three dimensional structure to be coated by the coating material; the multiple iteration printing scheme may be responsive to a shape and size of the at least one three dimensional structure; performing multiple printing iterations of the coating material, according to the multiple iteration printing scheme; at least one printing iteration followed by at least partially curing the coating material printed during the at least one printing iteration.

The method may include partially curing the coating material printed during each printing iteration except a last printing iteration; and fully curing the resistance coating material printed during the last printing iteration.

The duration of the partially curing may be shorter than a duration of the fully curing.

The duration of the partially curing may be shorter than one half of a duration of the fully curing.

The method may include applying a same amount of the coating material during each printing iteration.

The method may include applying different amounts of the coating material during at least two printing iteration.

The method may include altering at least one parameter of the coating material during the printing iterations.

The method may include altering at viscosity of the coating material during the printing iterations.

The coating material may be a solder ink.

The method may include determining the multiple iteration printing scheme in response to design information about the at least one three dimensional structure.

The method may include determining the multiple iteration printing scheme in response to design information about the at least one three dimensional structure be coated by the coating material and in response an expected thickness of a layer of coating material to be printed during a single printing iteration.

The method may include determining an amount of printing iteration to be not smaller than a ratio between a height of a highest three-dimensional structure that should be coated by the solder mask and an expected thickness of a layer of coating material to be printed during a single printing iteration.

The method may include determining an amount of printing iteration to be not smaller than a ratio between a minimal thickness of the coating material to be printed as a result of the multiple printing iterations and an expected thickness of a layer of coating material to be printed during a single printing iteration.

The method may include simulating the multiple printing iterations of the coating material.

The at least one printing iteration may be followed by freezing the coating material printed during the printing iteration.

A system may be provided and may include a printing controller arranged to determine or receive a multiple iteration printing scheme indicative of multiple printing iterations of a coating material to be applied on an electrical circuit that may include at least one three dimensional structure to be coated by the coating material; the multiple iteration printing scheme may be responsive to a shape and size of the at least one three dimensional structure; a printing unit arranged to perform multiple printing iterations of the coating material, according to the multiple iteration printing scheme; a curing unit arranged to at least partially cure the coating material printed during at least one printing iteration.

The curing unit may be arranged to partially cure the coating material printed during each printing iteration except a last printing iteration; and fully cure the resistance coating material printed during the last printing iteration.

The a duration of the partially cure may be shorter than a duration of the fully cure.

The a duration of the partially cure may be shorter than one half of a duration of the fully cure.

The printing unit may be arranged to apply a same amount of the coating material during each printing iteration.

The printing unit may be arranged to apply different amounts of the coating material during at least two printing iteration.

The printing unit may be arranged to alter at least one parameter of the coating material during the printing iterations.

The printing unit may be arranged to alter at viscosity of the coating material during the printing iterations.

The coating material may be a solder ink.

The printing controller may be arranged to determine the multiple iteration printing scheme in response to design information about the at least one three dimensional structure.

The printing controller may be arranged to determine the multiple iteration printing scheme in response to design information about the at least one three dimensional structure be coated by the coating material and in response an expected thickness of a layer of coating material to be printed during a single printing iteration.

The printing controller may be arranged to determine an amount of printing iteration to be not smaller than a ratio between a height of a highest three-dimensional structure that should be coated by the solder mask and an expected thickness of a layer of coating material to be printed during a single printing iteration.

The printing controller may be arranged to determine an amount of printing iteration to be not smaller than a ratio between a minimal thickness of the coating material to be printed as a result of the multiple printing iterations and an expected thickness of a layer of coating material to be printed during a single printing iteration.

The printing controller may be arranged to simulate the multiple printing iterations of the coating material.

The system may include a freezing unit arranged to freeze freezing a coating material printed during at least one printing iteration.

BRIEF DESCRIPTION OF THE DRAWINGS

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

FIGS. 3A-3C illustrate a prior art copper conductor;

FIG. 4 illustrates a method according to an embodiment of the invention.

DETAILED DESCRIPTION OF THE DRAWINGS

Figure 1:
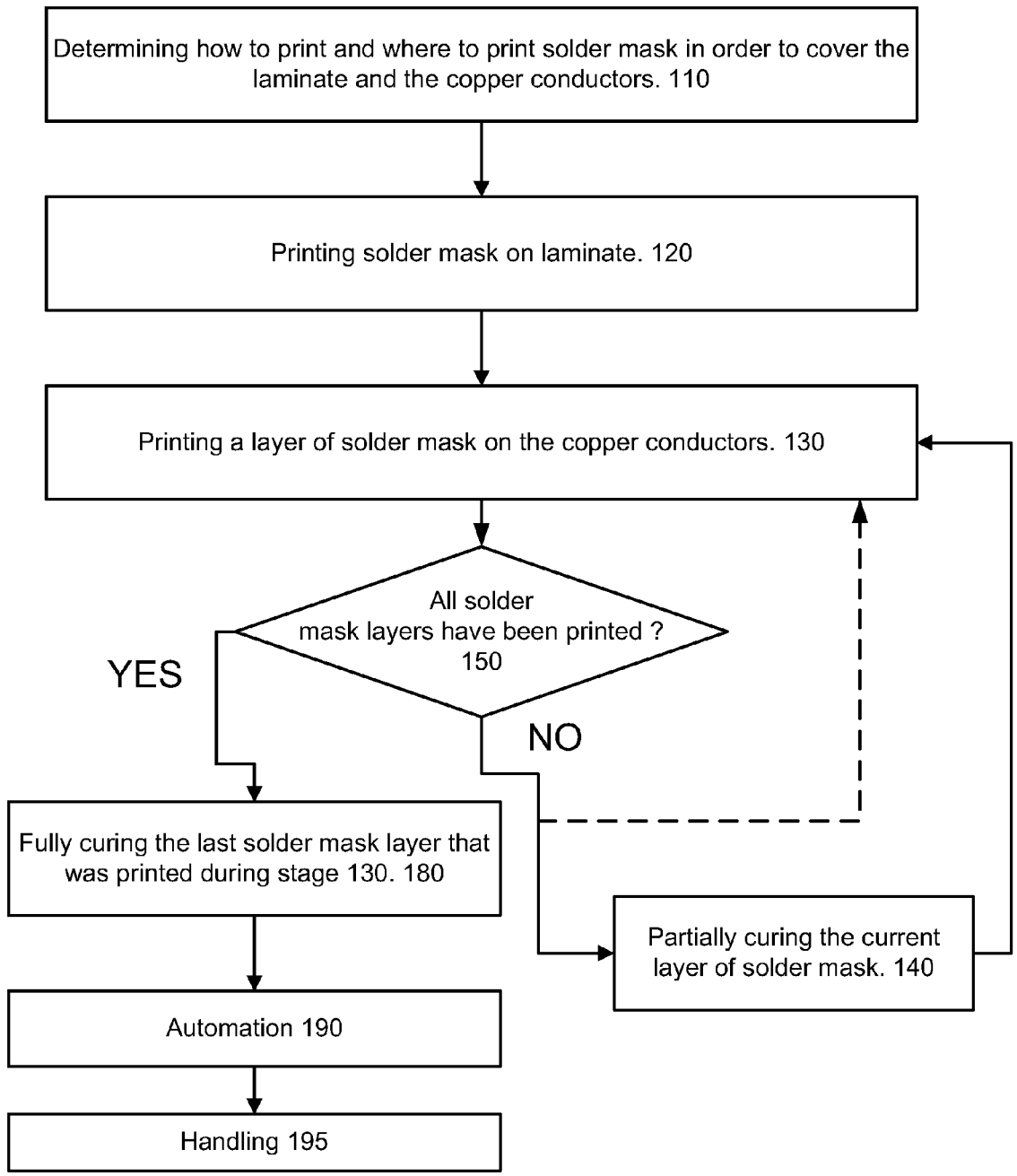
FIG. 1 illustrates a method according to an embodiment of the invention.

In the following detailed description, numerous specific details are presented in order to provide a thorough understanding of the invention. However, it will be understood by those skilled in the art that the present invention may be practiced without these specific details. In other instances, well-known methods, procedures, and components have not been described in detail so as not to obscure the present invention.

In the following detailed description, numerous specific details are presented in order to provide a thorough understanding of the invention. However, it will be understood by those skilled in the art that the present invention may be practiced without these specific details. In other instances, well-known methods, procedures, and components have not been described in detail so as not to obscure the present invention.

A sufficiently thick layer of solder mask can be applied on copper conductors in order to allow the solder mask layer to withstand aggressive finishing processes such as Electroless Nickel Immersion Gold (ENIG). Even if chemically attacked during such aggressive ENIG process, enough solder mask remains to adequately cover the copper conductor.

The suggested method provides a solder mask layer that has a thickness that is above a minimum thickness required to coat copper conductors.

The method mentioned below can be used to achieve a chemically or mechanically resistant solder mask layer for any demanding PCB finishing process such as but not limited to immersion silver, Immersion tin etc.

The method can include receiving design information about the object to be coated with solder mask, and especially the profile of the three-dimensional conductors that should be coated by the solder mask, and determining how to coat them. The determination can be in response to a minimal required thickness of the solder mask layer and the shape of the three-dimensional conductors. As a rule of thumb, high and narrow conductors that are spaced apart from each other may require special attention compared to densely placed conductors when coated with thicker solder mask layer—this is especially true relating to the vertical walls of such conductors. The coating profile can be determined by simulating the behavior of the solder mask that is injected and at least partially cured before printing another layer of solder mask.

The method can include receiving Computer Aided Design (CAD) information about copper conductors (including solder pads) and optionally other PCB areas, and defining how to coat these PCB areas depending on their special solder mask printing needs from the point of view of panel topography/surface preparation, solder mask and process characteristics. The method may include printing multiple solder mask layers, in a sequential manner, and (except for the last solder mask layer) partially curing each solder mask layer. It is noted that any solder mask layer can be either fully/partially cured or not cured before proceeding to coating the next solder mask layer.

Generating a thick enough solder mask coating is more practical when applying multiple iterations of solder mask printing, as the solder mask material that can be used in such a process can be less viscous and can be better fitted to ink jetting.

FIG. 1 illustrates method 100 according to an embodiment of the invention.

Method 100 starts by stage 110 of determining how to print and where to print solder mask in order to cover the laminate and the copper conductors.

Stage 110 may be followed by stage 120 of printing solder mask on laminate. Stage 120 can be followed by a delay during which the solder mask starts to dry.

Stage 120 is followed by a sequence of stages 130-150.

Stage 130 includes printing a layer of solder mask on the copper conductor (and optionally on their vicinity).

Stage 130 is followed by stage 150 of checking if all solder mask layers have been printed. If so—stage 150 is followed by stage 180. Otherwise stage 150 is followed by stage 140 of partially curing the current layer of solder mask.

It is noted that stage 150 can be followed by stage 130 without executing stage 140 of at least partially curing the current layer of the solder mask.

Stage 140 consists of partially curing the first layer of solder mask. The curing can include applying partial radiation or heat (for example 20-70% of radiation or heat), applying heat or radiation for a portion of a full curing duration and the like. The partially curing and the full curing may including curing by ultraviolet (UV) radiation.

Stage 140 is followed by stage 130 thereby allowing to print multiple layers in the vicinity of the elevated conductors.

When it is determined by stage 150 that all layers have been printed, stage 180 includes fully curing the last solder mask layer that was printed during stage 130.

Stage 180 is followed by removing the PCB (automation 190 and handling 195).

Figure 2:
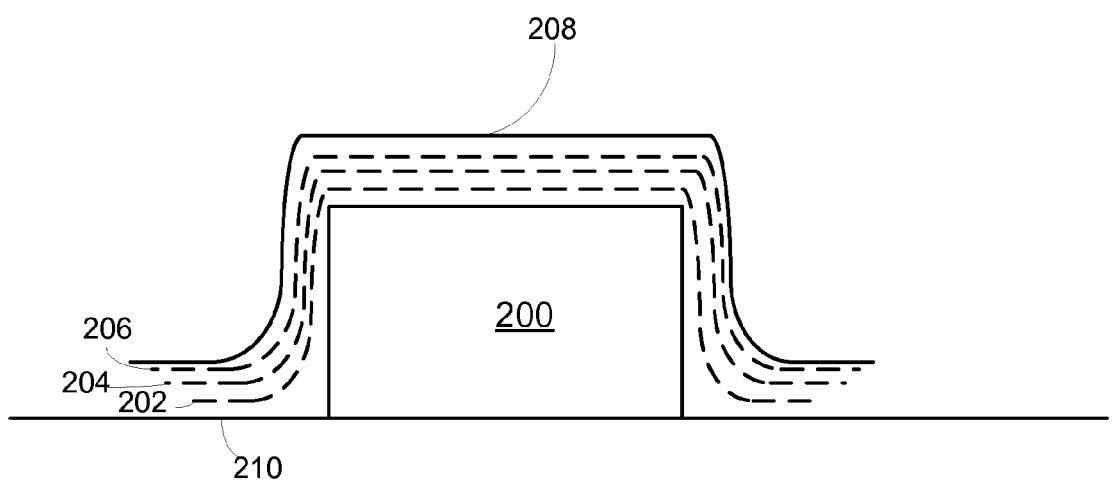
FIG. 2 illustrates a cross section of a copper conductor and solder mask, according to an embodiment of the invention.

FIG. 2 illustrates a cross section of a conductor 200 that may be positioned on a laminate layer 210. The conductor 200 may be covered by multiple layers 202-208 of solder mask. The dashed lines (denoted 202-206) illustrate different solder mask layers. The last solder mask 208 is denoted 208. Such a multi-layered solder mask coating (layers 202-208) is thick enough to withstand the ENIG process.

Figure 3B:
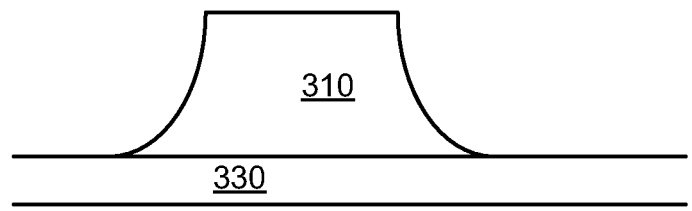

FIG. 3A illustrates a three dimensional structure 310 that includes a linear conductor that ends with a tubular pad. The three dimensional structure 310 is located above a laminate surface 330. Dashed line 320 illustrates an imaginary cross section plane. The cross sections of FIGS. 3A-3D are taken along this imaginary plane.

FIG. 3B is a cross sectional view taken along the imaginary plane referred to by dashed line 320.

Figure 3C:
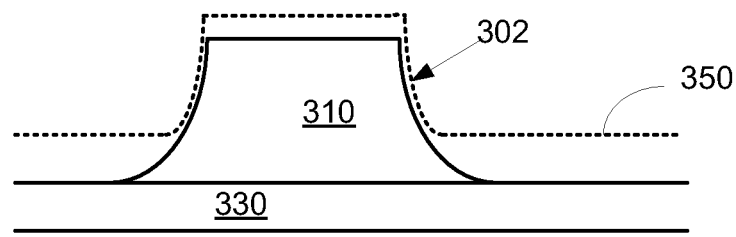

FIG. 3C is a cross sectional view of the three dimensional structure 310, the laminate 330 and a single layer 350 of a coating material. Although the single layer surrounds the three dimensional structure 310 it is too thin (see for example point 302) and thus is expected to be corroded and removed at such points during a chemical process that will follow the coating.

Figure 3D:
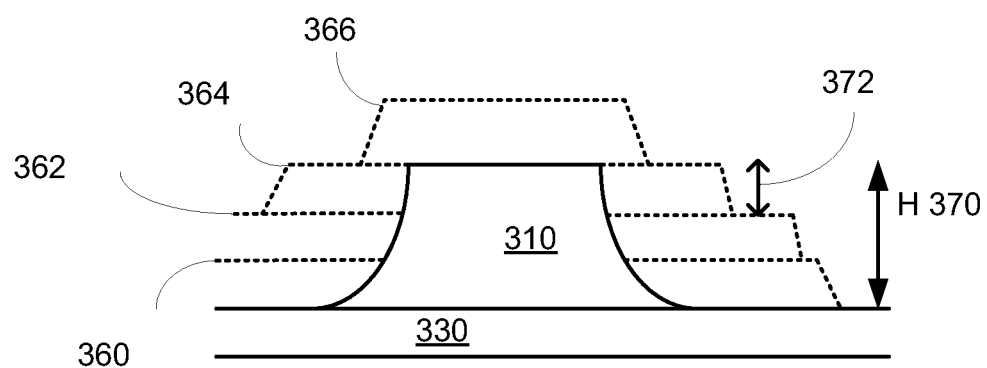
FIG. 3D illustrates a cross section of a copper conductor and solder mask, according to an embodiment of the invention.

FIG. 3D is a cross sectional view of the three dimensional structure 310, the laminate 330 and a multiple layer 360, 362, 364 and 366 of the coating material 350.

It is noted that the height of the three dimensional structure is H (370) and the thickness of each layer of a coating material is T 372. The number of printing iterations can be set to be equal to 1+(H/T) or to exceed 1+(H/T).

Although the single layer surrounds the three dimensional structure 310 it is too thin (see for example point 302) and thus is expected to be corroded and removed at such points during a chemical process that will follow the coating.

FIG. 4 illustrates method 400 according to an embodiment of the invention.

Method 400 may start by stage 410 or by stage 420.

Stage 410 may include determining a multiple iteration printing scheme indicative of multiple printing iterations of a coating material to be applied on an electrical circuit that comprises at least one three dimensional structure to be coated by the coating material. The multiple iteration printing scheme may be responsive to a shape and size of the at least one three dimensional structure.

Stage 410 may include stage 411 of determining the multiple iteration printing scheme in response to design information about the at least one three dimensional structure.

Stage 410 may include stage 412 of determining the multiple iteration printing scheme in response to design information about the at least one three dimensional structure be coated by the coating material and in response an expected thickness of a layer of coating material to be printed during a single printing iteration.

Stage 410 may include stage 413 of determining an amount of printing iteration to be not smaller than a ratio between a height of a highest three-dimensional structure that should be coated by the solder mask and an expected thickness of a layer of coating material to be printed during a single printing iteration.

Stage 410 may include stage 414 of determining an amount of printing iteration to be not smaller than a ratio between a minimal thickness of the coating material to be printed as a result of the multiple printing iterations and an expected thickness of a layer of coating material to be printed during a single printing iteration.

Stage 410 may include stage 416 of simulating the multiple printing iterations of the coating material.

Stage 420 may include receiving a multiple iteration printing scheme indicative of multiple printing iterations of a coating material to be applied on an electrical circuit that comprises at least one three dimensional structure to be coated by the coating material. The multiple iteration printing scheme may be responsive to a shape and size of the at least one three dimensional structure.

Stage 410 and 420 are followed by stage 430 of performing multiple printing iterations of the coating material, according to the multiple iteration printing scheme.

Stage 430 may include stage 432 of performing a printing iteration of the coating material.

Stage 432 may be followed by stage 434 of performing, on the coating material printed during the printing iteration at least one operation out of freezing the coating material, partially curing the coating material, fully curing the coating material or doing nothing.

Stage 434 may be followed of stage 436 of determining whether all the printing iterations were completed—if so the stage 430 ends, else stage 436 may be followed by stage 438 of changing at least one parameter of the printing operation—if required according to the multiple printing iteration scheme—and jumping to stage 432.

Thus, at least one printing iteration may be followed by at least partially curing the coating material printed during the at least one printing iteration.

Stage 430 may include partially curing the coating material printed during each printing iteration except a last printing iteration; and fully curing the resistance coating material printed during the last printing iteration.

The duration of the partially curing can be shorter than a duration of the fully curing.

The duration of the partially curing can be shorter than one half of a duration of the fully curing.

Stage 430 may include applying a same amount of the coating material during each printing iteration.

Stage 430 may include applying different amounts of the coating material during at least two printing iteration.

Stage 430 may include altering at viscosity of the coating material during the printing iterations.

The coating material can be a solder mask ink.

Figure 5:
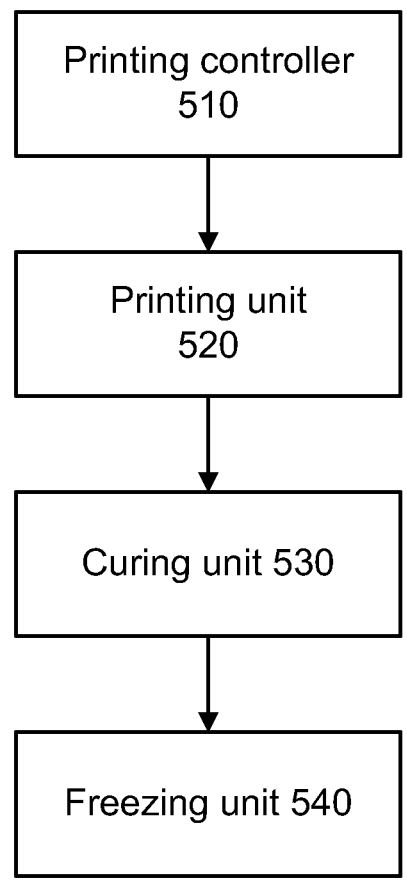
FIG. 5 illustrates a system according to an embodiment of the invention.

FIG. 5 illustrates system 500 according to an embodiment of the invention.

System 500 can include any of the methods mentioned in this specification.

System 500 may include a printing controller 510, a printing unit 520 and a curing unit 530. These components may be separated from each other or integrated together.

The printing controller 510 may be arranged to determine or receive a multiple iteration printing scheme indicative of multiple printing iterations of a coating material to be applied on an electrical circuit that comprises at least one three dimensional structure to be coated by the coating material; wherein the multiple iteration printing scheme may be responsive to a shape and size of the at least one three dimensional structure.

The printing unit 520 may be arranged to perform multiple printing iterations of the coating material, according to the multiple iteration printing scheme.

The curing unit 530 may be arranged to at least partially cure the coating material printed during at least one printing iteration.

The curing unit 530 may be arranged to partially cure the coating material printed during each printing iteration except a last printing iteration; and fully cure the resistance coating material printed during the last printing iteration.

A duration of the partially cure may be shorter than a duration of the fully cure.

A duration of the partially cure may be shorter than one half of a duration of the fully cure.

The printing unit 520 may be arranged to apply a same amount of the coating material during each printing iteration.

The printing unit 520 may be arranged to apply different amounts of the coating material during at least two printing iteration.

The printing unit 520 may be arranged to alter at least one parameter of the coating material during the printing iterations.

The printing unit 520 may be arranged to alter at viscosity of the coating material during the printing iterations.

The coating material may be a solder ink.

The printing controller 510 may be arranged to determine the multiple iteration printing scheme in response to design information about the at least one three dimensional structure.

The printing controller 510 may be arranged to determine the multiple iteration printing scheme in response to design information about the at least one three dimensional structure be coated by the coating material and in response an expected thickness of a layer of coating material to be printed during a single printing iteration.

The printing controller 510 may be arranged to determine an amount of printing iteration to be not smaller than a ratio between a height of a highest three-dimensional structure that should be coated by the solder mask and an expected thickness of a layer of coating material to be printed during a single printing iteration.

The printing controller 510 may be arranged to determine an amount of printing iteration to be not smaller than a ratio between a minimal thickness of the coating material to be printed as a result of the multiple printing iterations and an expected thickness of a layer of coating material to be printed during a single printing iteration.

The printing controller 510 may be arranged to simulate the multiple printing iterations of the coating material.

The system 500 may include a freezing unit 540 that may be arranged to freeze the coating material printed during at least one printing iteration.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method, comprising:
   determining or receiving a multiple iteration printing scheme indicative of multiple printing iterations of a coating material to be applied on an electrical circuit that comprises at least one three dimensional structure to be coated by the coating material; wherein the multiple iteration printing scheme is responsive to a shape and size of the at least one three dimensional structure; wherein the coating material is solder mask;
   performing multiple printing iterations of the coating material, according to the multiple iteration printing scheme; wherein each printing iteration except a last printing iteration is followed by partially curing, before executing a next printing iteration, coating material printed during the printing iteration; and wherein the last printing iteration is followed by fully curing coating material printed during the last printing iteration; wherein the partially curing and the fully curing differ from each other only by at least one out of (a) amount of heat or radiation and (b) duration.

2. The method according to claim 1, wherein multiple iteration printing scheme is designed to provide a solder mask coating that is expected to withstand a Electroless Nickel Immersion Gold process; wherein a shape of a three dimensional structure out of the at least one three dimensional structures after being coated by the coating material tracks a shape of the three dimensional; structure before being coated by the coating material.

3. The method according to claim 1, wherein the partially curing and the fully curing comprises radiating the coating material with ultraviolet radiation.

4. The method according to claim 1, wherein there are at least four layers.

5. The method according to claim 1, comprising applying a same amount of the coating material during each printing iteration.

6. The method according to claim 1, comprising applying different amounts of the coating material during at least two printing iteration.

7. The method according to claim 1, comprising altering at least one parameter of the coating material only between one printing iteration to another printing iteration.

8. The method according to claim 1, comprising altering at viscosity of the coating material only between one printing iteration to another printing iteration.

9. The method according to claim 1, wherein the coating material is a solder ink.

10. The method according to claim 1, comprising determining the multiple iteration printing scheme in response to computer aided design information about the at least one three dimensional structure.

11. The method according to claim 1, comprising determining the multiple iteration printing scheme in response to computer aided design information about the at least one three dimensional structure to be coated by the coating material and in response an expected thickness of a layer of coating material to be printed during a single printing iteration.

12. The method according to claim 11, comprising determining an amount of printing iteration to be not smaller than a ratio between a height of a highest three-dimensional structure that should be coated by the coating material and an expected thickness of a layer of coating material to be printed during a single printing iteration.

13. The method according to claim 11, comprising determining an amount of printing iteration to be not smaller than a ratio between a minimal thickness of the coating material to be printed as a result of the multiple printing iterations and an expected thickness of a layer of coating material to be printed during a single printing iteration.

14. The method according to claim 11, comprising simulating the multiple printing iterations of the coating material.

15. The method according to claim 1, wherein at least one printing iteration is followed by freezing the coating material printed during the printing iteration.

16. The method according to claim 1 wherein the performing of the multiple printing iterations of the coating material comprises coating a top portion and sidewalls of one or more three dimensional structures of the electrical circuit.

17. The method according to claim 16 wherein the one or more three dimensional structures of the electrical circuit have a width to height ratio of two.

18. A method, comprising:
   determining or receiving a multiple iteration printing scheme indicative of multiple printing iterations of a coating material to be applied on an electrical circuit that comprises at least one three dimensional structure to be coated by the coating material; wherein the multiple iteration printing scheme is responsive to a shape and size of the at least one three dimensional structure;
   performing multiple printing iterations of the coating material thereby coating a top portion and sidewalls of one or more three dimensional structure of the electrical circuit, according to the multiple iteration printing scheme; wherein at least one printing iteration is followed by at least partially curing the coating material printed during the at least one printing iteration;
   wherein each printing iteration except a last printing iteration is followed by partially curing, before executing a next printing iteration, coating material printed during the printing iteration; and
   wherein the last printing iteration is followed by fully curing coating material printed during the last printing iteration; wherein the coating material is solder mask;
   wherein the partially curing and the fully curing differ from each other only by at least one out of (a) amount of heat or radiation and (b) duration.

19. The method according to claim 18 wherein the partially curing and the fully curing comprises radiating the coating material with ultraviolet radiation.

20. The method according to claim 18, wherein the determining of the multiple iteration printing scheme is designed to provide a solder mask coating that is expected to withstand a Electroless Nickel Immersion Gold process; wherein a shape of a three dimensional structure out of the at least one three dimensional structures after being coated by the coating material tracks a shape of the three dimensional; structure before being coated by the coating material.

21. The method according to claim 18, comprising applying different amounts of the coating material during at least two printing iteration.

22. The method according to claim 18, comprising altering at least one parameter of the coating material only between one printing iteration to another printing iteration.

23. The method according to claim 18, comprising altering at viscosity of the coating material only between one printing iteration to another printing iteration.

24. The method according to claim 18, wherein at least one printing iteration is followed by freezing the coating material printed during the printing iteration.

25. The method according to claim 18, comprising determining the multiple iteration printing scheme in response to computer aided design information about the at least one three dimensional structure.

26. The method according to claim 25 comprising determining an amount of printing iteration to be not smaller than a ratio between a minimal thickness of the coating material to be printed as a result of the multiple printing iterations and an expected thickness of a layer of coating material to be printed during a single printing iteration.

27. The method according to claim 18, comprising determining the multiple iteration printing scheme in response to design information about the at least one three dimensional structure to be coated by the coating material and in response to an expected thickness of a layer of coating material to be printed during a single printing iteration.

28. The method according to claim 27, comprising determining an amount of printing iteration to be not smaller than a ratio between a height of a highest three-dimensional structure that should be coated by the coating material and an expected thickness of a layer of coating material to be printed during a single printing iteration.

29. The method according to claim 27, comprising simulating the multiple printing iterations of the coating material.

* * * * *